(12) United States Patent
Ken et al.

(10) Patent No.: US 9,164,942 B2
(45) Date of Patent: Oct. 20, 2015

(54) HIGH SPEED MEMORY CHIP MODULE AND ELECTRONICS SYSTEM DEVICE WITH A HIGH SPEED MEMORY CHIP MODULE

(71) Applicant: Etron Technology, Inc., Hsinchu (TW)

(72) Inventors: Weng-Dah Ken, Hsinchu (TW); Nicky Lu, Taipei (TW)

(73) Assignee: Etron Technology, Inc., Hsinchu (TW)

( * ) Notice: Subject to any disclaimer, the term of this patent is extended or adjusted under 35 U.S.C. 154(b) by 624 days.

(21) Appl. No.: 13/649,131

(22) Filed: Oct. 11, 2012

(65) Prior Publication Data

US 2013/0091315 A1 Apr. 11, 2013

Related U.S. Application Data

(60) Provisional application No. 61/546,039, filed on Oct. 11, 2011.

(51) Int. Cl.
*G11C 5/06* (2006.01)
*G06F 13/40* (2006.01)
*G11C 7/10* (2006.01)

(52) U.S. Cl.
CPC *G06F 13/40* (2013.01); *G11C 7/10* (2013.01); *H01L 2224/16145* (2013.01); *H01L 2224/16225* (2013.01); *H01L 2224/32225* (2013.01); *H01L 2224/48227* (2013.01); *H01L 2224/73265* (2013.01); *H01L 2225/0651* (2013.01); *H01L 2225/06513* (2013.01); *H01L 2225/06541* (2013.01); *H01L 2225/06568* (2013.01); *H01L 2924/13091* (2013.01); *H01L 2924/1431* (2013.01); *H01L 2924/1434* (2013.01); *H01L 2924/15311* (2013.01); *H01L 2924/3025* (2013.01)

(58) Field of Classification Search
CPC ................................................ G11C 5/00
USPC ............ 365/63, 185.05, 185.06, 185.11, 214
See application file for complete search history.

(56) References Cited

U.S. PATENT DOCUMENTS

| | | | |
|---|---|---|---|
| 6,317,377 B1 | 11/2001 | Kobayashi | |
| 7,013,359 B1 * | 3/2006 | Li | ................................. 710/305 |
| 7,206,876 B2 * | 4/2007 | Jang | ................................. 710/66 |
| 7,245,239 B2 | 7/2007 | Wallner | |
| 7,385,281 B2 | 6/2008 | Nishio | |
| 7,546,497 B2 * | 6/2009 | Jang | ............................. 714/718 |
| 7,680,966 B1 * | 3/2010 | Falik et al. | ....................... 710/45 |
| 7,810,017 B2 * | 10/2010 | Radke | ........................... 714/769 |
| 7,903,685 B2 * | 3/2011 | Eshraghian | ................... 370/466 |
| 8,036,052 B2 * | 10/2011 | Lee et al. | ....................... 365/201 |
| 8,473,653 B2 | 6/2013 | Kondo | |
| 8,803,545 B2 | 8/2014 | Yoko | |

(Continued)

Primary Examiner — Harry W Byrne
(74) Attorney, Agent, or Firm — Winston Hsu; Scott Margo

(57) ABSTRACT

A high speed memory chip module includes a type of memory cell array group and a logic unit. The type memory cell array group includes multiple memory cell array integrated circuits (ICs), and each of the memory cell array ICs has a data bus and at least one memory cell array, and corresponds to first metal-oxide-semiconductor field-effect transistor (MOSFET) gate length corresponding to a first MOSFET process. The logic unit accesses the type of memory cell array group through a first transmission bus, where bus width of the first transmission bus is wider than bus width of the data bus of each of the memory cell array ICs. Corresponding to a second MOSFET process, the logic unit has a second MOSFET gate length which is shorter than the first MOSFET gate length.

31 Claims, 13 Drawing Sheets

(56) References Cited

U.S. PATENT DOCUMENTS

2004/0246801 A1* 12/2004 Lee et al. .................. 365/221
2004/0260864 A1* 12/2004 Lee et al. .................. 711/101
2007/0005831 A1* 1/2007 Gregorius .................. 710/52
2009/0024790 A1  1/2009 Rajan
2009/0039492 A1  2/2009 Kang
2010/0235554 A1* 9/2010 Chang et al. ............... 710/104

* cited by examiner

HIGH SPEED MEMORY CHIP MODULE AND ELECTRONICS SYSTEM DEVICE WITH A HIGH SPEED MEMORY CHIP MODULE

CROSS REFERENCE TO RELATED APPLICATIONS

This application claims the benefit of U.S. Provisional Application No. 61/546,039, filed on Oct. 11, 2011 and entitled "High Speed Memory Platform," the contents of which are incorporated herein by reference.

BACKGROUND OF THE INVENTION

1. Field of the Invention

The present invention relates to a high speed memory chip module and a electronics system device with a high speed memory chip module, and particularly to a high speed memory chip module and an electronics system device with a high speed memory chip module that have lower power consumption, lower effective greenhouse gas emission rate, higher data transmission efficiency, enhanced electromagnetic interference (EMI) shielding effect, better heat dissipation capability, and an external noise isolation function.

2. Description of the Prior Art

Generally speaking, memories are usually designed as standard memory module or chip which are independent from logic units based on certain industry standard (e.g. Joint Electronic Device Engineering Council, JEDEC is the exemplary one). That is to say, memories are designed typically as standard memory module or chip for various logic units based on certain industry standard, but not for predetermined logic units.

In the prior art, because memory semiconductor process generations are typically more advanced and different from logic unit semiconductor process generations. That is to say, a chip or module memory system, integrating discrete memories with the advanced semiconductor process generations, may face poorer heat dissipation, higher power consumption and bad noise interference, so the chip or module memory system with integrating memories and logic units still suffers from much manufacturing difficulty.

SUMMARY OF THE INVENTION

An embodiment provides a high speed memory chip module. The high speed memory chip module includes a type of memory cell array group and a logic unit. The type of memory cell array group includes multiple memory cell array integrated circuits (ICs). Each of the memory cell array ICs has an input/output (I/O) data bus. The memory cell array IC further includes at least one memory cell array and corresponds to a first metal-oxide-semiconductor field-effect transistor (MOSFET) gate length corresponding to a first MOSFET process. The logic unit is used for accessing the type of memory cell array group through a first transmission bus, wherein the first transmission bus is used for transmitting a first set of parallel data along with the memory cell array ICs, and bus width of the first transmission bus is wider than bus width of the data bus of each of the memory cell array ICs, wherein the logic unit corresponds to a second MOSFET process, the second MOSFET process corresponds to a second MOSFET gate length of a standard logic cell for the logic unit, and the first MOSFET gate length is longer than the second MOSFET gate length. The logic unit is further used for converting the first set of parallel data of the first transmission bus into a second set of parallel data through the second transmission bus.

Another embodiment provides an electronics system device with a high speed memory chip module. The electronics system device includes an ASIC processor, a type of memory cell array group and a logic unit. The type of memory cell array group comprises multiple memory cell array ICs, each of the memory cell array ICs has an (I/O) data bus. The logic unit is used for accessing the type of memory cell array group through a first transmission bus, wherein the first transmission bus is used for transmitting a first set of parallel data along with the memory cell array ICs, and bus width of the first transmission bus is wider than bus width of the data bus of each of the memory cell array ICs. The logic unit is further used for converting the first set of parallel data of the first transmission bus into a second set of parallel data through the second transmission bus, and transmits the second set of parallel data to the ASIC processor. The ASIC processor executes a predetermined function corresponding to the second set of parallel data while the ASIC processor is under operating condition, wherein bit width of the first set and the second set of parallel data are different. In one embodiment, the system power efficiency can be higher if bit width of the first transmission bus is wider than the second one. On the other hand, in another embodiment, the system data transmission bandwidth and noise level can be best optimized if the second transmission bus is wider than the first one.

The present invention provides a high speed memory chip module and an electronics system device with a high speed memory chip module. The high speed memory chip module and the electronics system device have advantages as follows: first, a signal swing of data transmitted through a first transmission bus and a signal swing of data transmitted through a second transmission bus can be varied with different memory interface standards or be better optimized with different semiconductor processes. The present invention not only has the ability to lower power consumption while operating, but also has the advantage to achieve higher transmission efficiency or bandwidth. Second, the present invention can utilize a plurality of through silicon via (TSV) outside a first seal ring of each memory cell array IC or a plurality of TSV outside a second seal ring of a logic unit to form a metal fence function. The conductive or metal fence of the present invention can perform a better EMI shielding effect, better heat dissipation capability, or an external noise isolation function based on the magnetic-electronic theory available today. Therefore, compared to the prior art, the present invention has the advantage of achieving lower power consumption, higher transmission efficiency, better EMI shielding effect, better heat dissipation capability, and with better external noise isolation functions.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
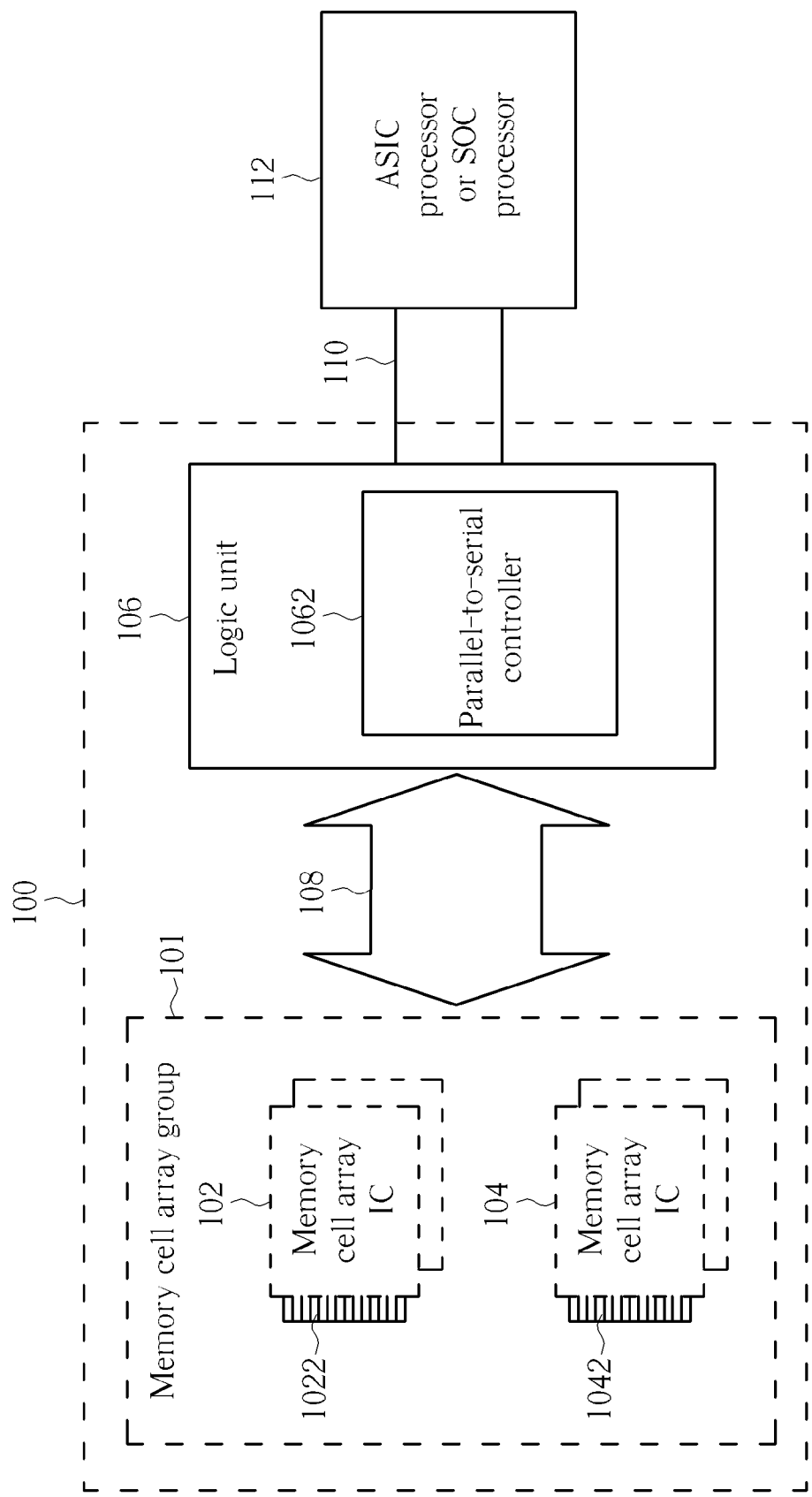
FIG. 1 is a diagram illustrating a high speed memory chip module according to an embodiment.

Please refer to FIG. 1. FIG. 1 is a diagram illustrating a high speed memory chip module 100 according to an embodiment. The high speed memory chip module 100 includes a type of memory cell array group 101 and a logic unit 106, where the type of memory cell array group 101 includes a memory cell array integrated circuit (IC) 102 which is a Dynamic Random Access Memory (DRAM) IC and a memory cell array IC 104 which is a flash or non-volatile memory (NVM) IC. But, the present invention is not limited to the high speed memory chip module 100 including the type memory cell array group 101 which includes the memory cell array IC 102 and the memory cell array IC 104, and also not limited to the memory cell array IC 102 being a DRAM IC and the memory cell array IC 104 being a flash or non-volatile memory IC. That is to say, the memory cell array IC 102 and the memory cell array IC 104 can also be other type of memory ICs. In addition, each of the memory cell array ICs 102, 104 has an input/output (I/O) data bus and at least one memory cell array. For example, the memory cell array IC 102 has an I/O data bus 1022 and two memory cell arrays, and the memory cell array IC 104 has an I/O data bus 1042 and two memory cell arrays, where the data bus 1022 and the data bus 1042 have a wired or wireless transmission function along with the logic unit. But, the present invention is not limited to the memory cell array IC 102 having two memory cell arrays and the memory cell array IC 104 having two memory cell arrays. As shown in FIG. 1, the logic unit 106 is used for accessing the memory cell array IC 102 and the memory cell array IC 104 through a first transmission bus 108, where the first transmission bus 108 is used for transmitting a first set of parallel data, and bus width (e.g. 128 bits or 256 bits or more) of the first transmission bus 108 is wider than bus width (e.g. 8 bits or 16 bits or more) of the I/O data bus 1022 and bus width (e.g. 8 bits or 16 bits or more) of the I/O data bus 1042. When the logic unit 106 accesses the first set of parallel data through the first transmission bus 108, the logic unit 106 utilizes a parallel-to-serial controller 1062 included thereof to convert the first set of parallel data into a second set of parallel data, and transmits the second set of parallel data to an application-specific integrated circuit (ASIC) 112 (or system on chip (SOC) processor through a second transmission bus 110 (e.g. a 32 bits serial bus), where the second transmission bus 110 can be comprised of protocol of a Universal Serial Bus 2.0 (USB 2.0), a USB 3.0, a Serial Advanced Technology Attachment (SATA) bus, a Universal Flash Storage (UFS) bus, a mobile industry processor interface (MIPI) bus, or a Peripheral Component Interconnect Express (PCIE) bus. Then, the ASIC processor 112 can execute a predetermined function according to the second set of parallel data. As shown in FIG. 1, the logic unit 106 can be designed as a "parallel-to-serial bus" bridge, receives the first set of parallel data through the first transmission bus 108 with wider bus width (e.g. 128 bits or 256 bits or more), and utilizes the parallel-to-serial controller 1062 to convert the first set of parallel data into the second set of parallel data. In addition, the second transmission bus 110 and the first transmission bus 108 can also be wireless transmission buses to optimize between the power and throughput performance. For example, the second transmission bus 110 and the first transmission bus 108 can be buses for transmitting light or electromagnetic waves. As mentioned in one embodiment, the system power efficiency can be higher if bit width of the first transmission bus is wider than the second transmission bus. On the other hand, in another embodiment, the system data transmission bandwidth and noise level can be best optimized if the second transmission bus is wider than the first transmission bus.

Figure 2:
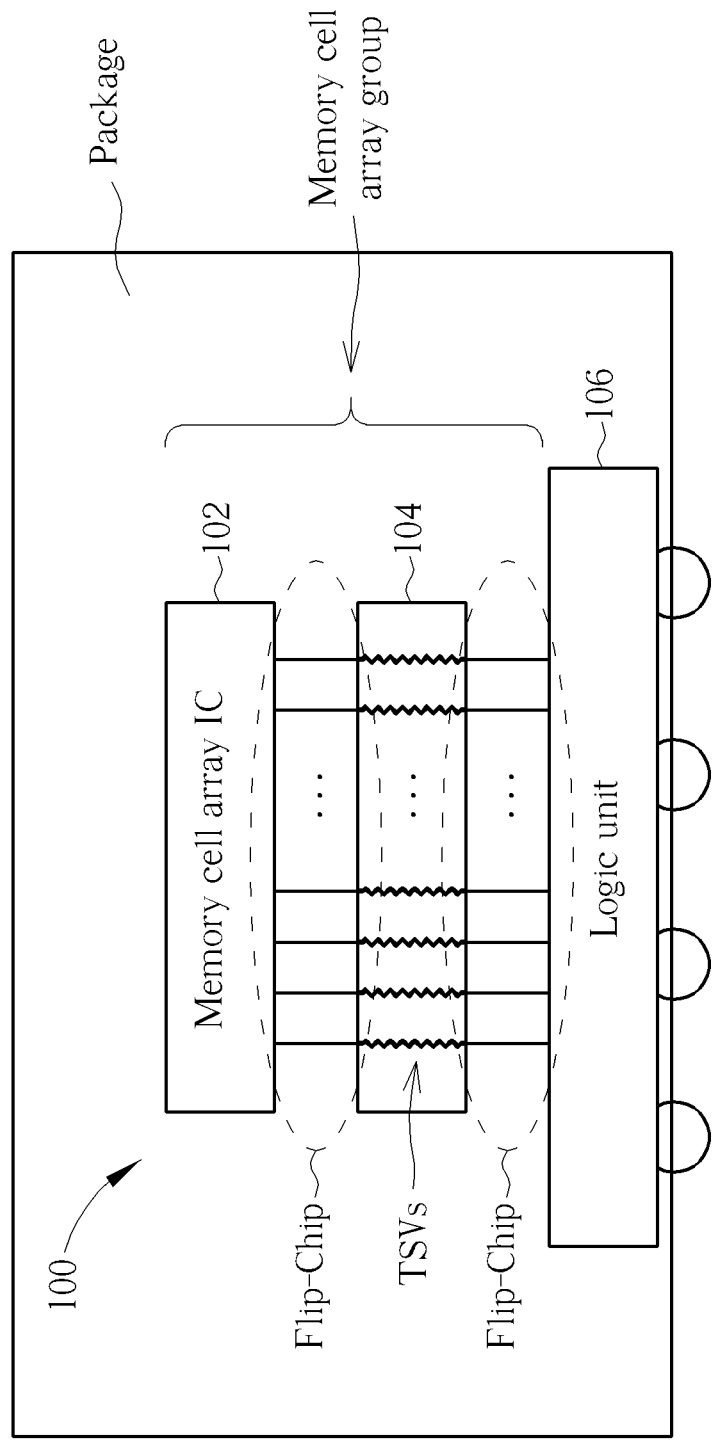
FIG. 2 is a diagram illustrating a cross-section of the high speed memory chip module.

Please refer to FIG. 2. FIG. 2 is a diagram illustrating a cross-section of the high speed memory chip module 100. As shown in FIG. 2, the memory cell array IC 102, the memory cell array IC 104, and the logic unit 106 are stacked each other (the memory cell array IC 102 and the memory cell array IC 104 are stacked over the logic unit 106) through Flip-Chip, where the Flip-Chip forms bumps on pads of the memory cell array IC 102, the memory cell array IC 104, and the logic unit 106, and then utilizes the bumps to make the memory cell array IC 102, the memory cell array IC 104, and the logic unit 106 be stacked over each other.

Figure 3:
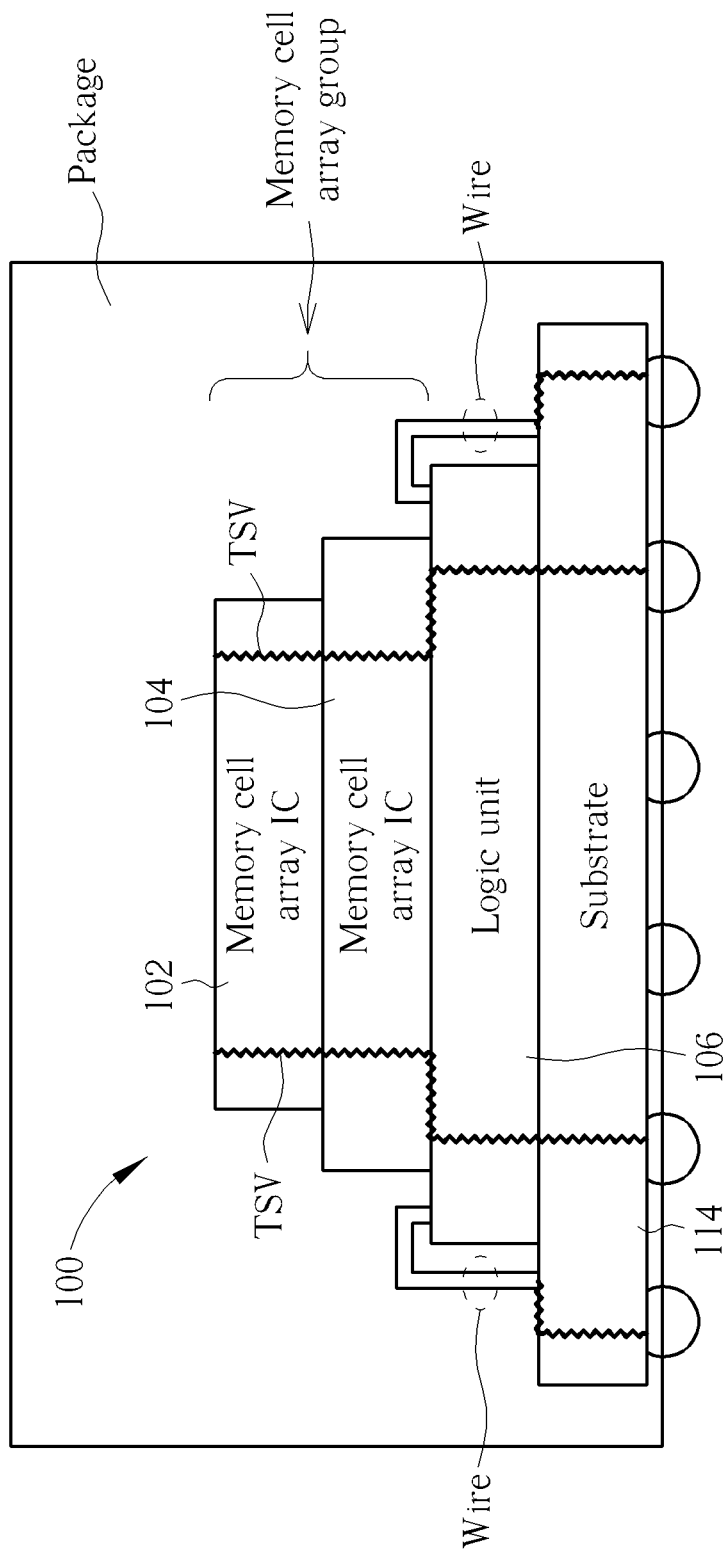
FIG. 3 is a diagram illustrating a cross-section of the high speed memory chip module according to another embodiment.

Please refer to FIG. 3. FIG. 3 is a diagram illustrating a cross-section of the high speed memory chip module 100 according to another embodiment. As shown in FIG. 3, the memory cell array IC 102, the memory cell array IC 104, and the logic unit 106 utilize wire bonding to connect to a substrate 114, where the memory cell array IC 102 and the memory cell array IC 104 are stacked over the logic unit 106.

Figure 4:
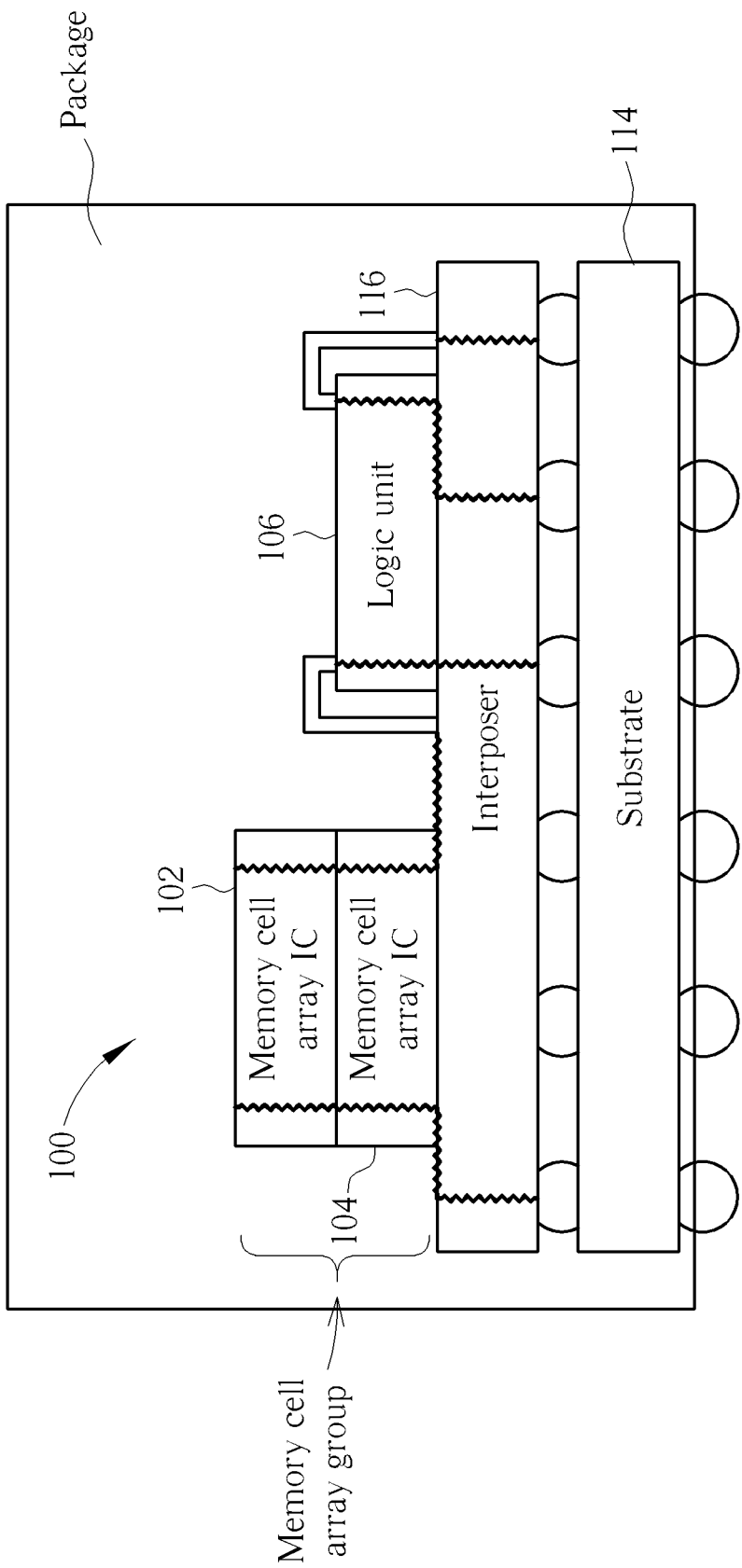
FIG. 4 is a diagram illustrating a cross-section of the high speed memory chip module according to another embodiment.

Please refer to FIG. 4. FIG. 4 is a diagram illustrating a cross-section of the high speed memory chip module 100 according to another embodiment. As shown in FIG. 4, the high speed memory chip module 100 further includes an interposer 116, where the interposer 116 can be silicon material or oxide glass material. But, the present invention is not limited to the interposer 116 being the silicon material or the oxide glass material. As shown in FIG. 4, the memory cell array IC 102 is stacked over the memory cell array IC 104, and the memory cell array IC 104 and the logic unit 106 are disposed over the two opposite sides of the interposer 116, respectively. In addition, the memory cell array IC 102, the memory cell array IC 104, and the logic unit 106 can utilize the wire bonding, the Flip-Chip, through silicon vias (TSVs), or wireless transmission to connect to each other.

Figure 5:
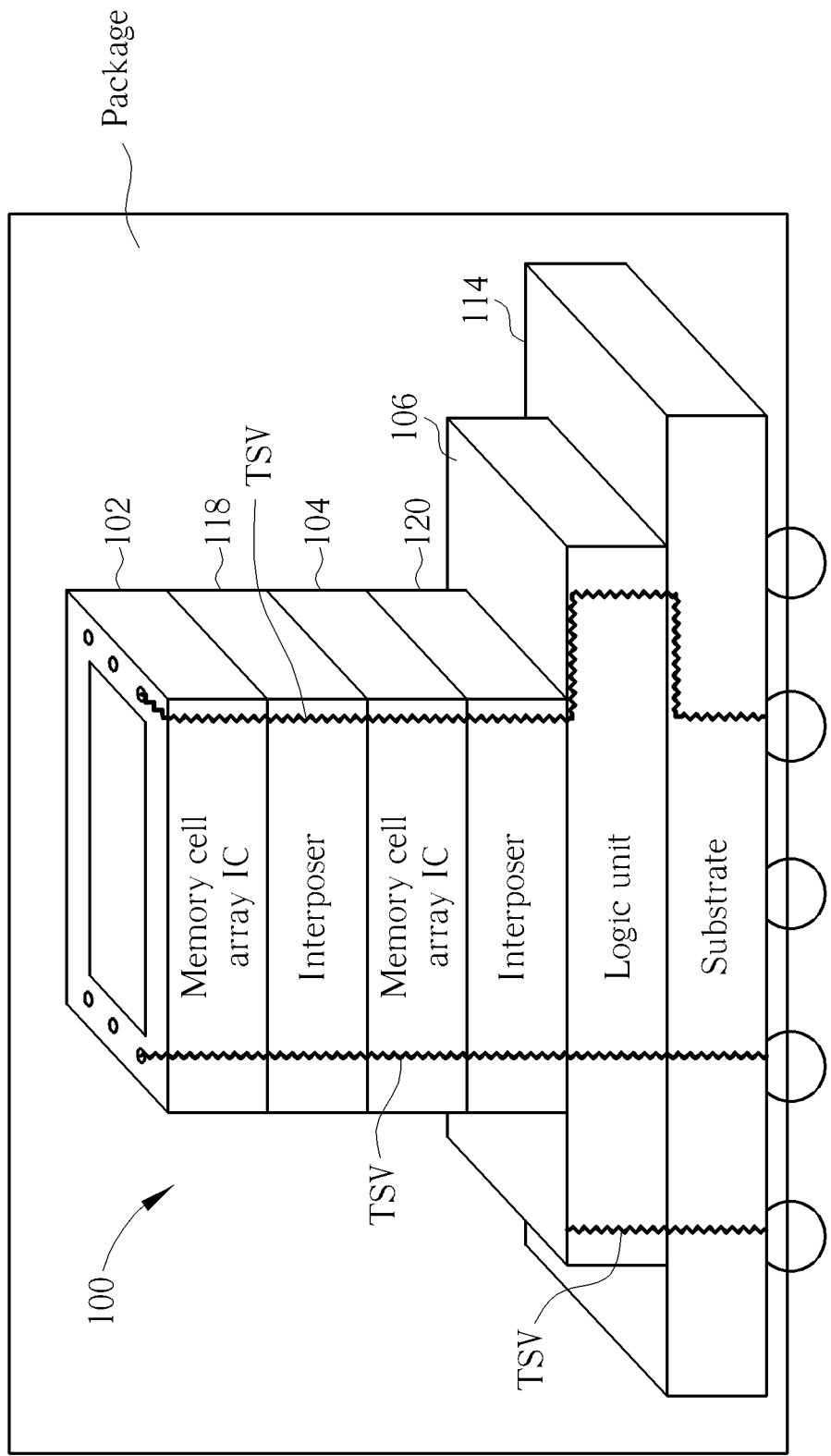
FIG. 5 is a diagram illustrating a cross-section of the high speed memory chip module according to another embodiment.

Please refer to FIG. 5. FIG. 5 is a diagram illustrating a cross-section of the high speed memory chip module 100 according to another embodiment. As shown in FIG. 5, the high speed memory chip module 100 further includes interposers 118, 120. As shown in FIG. 5, the memory cell array IC 102 is stacked over the interposer 118, the interposer 118 is stacked over the memory cell array IC 104, the memory cell array IC 104 is stacked over the interposer 120, the interposer 120 is stacked over the logic unit 106, and the logic unit 106 is stacked over the substrate 114. In addition, the memory cell array IC 102, the memory cell array IC 104, and the logic unit 106 can utilize the wire bonding, the Flip-Chip, the TSVs, or the wireless transmission to connect to each other.

Figure 6:
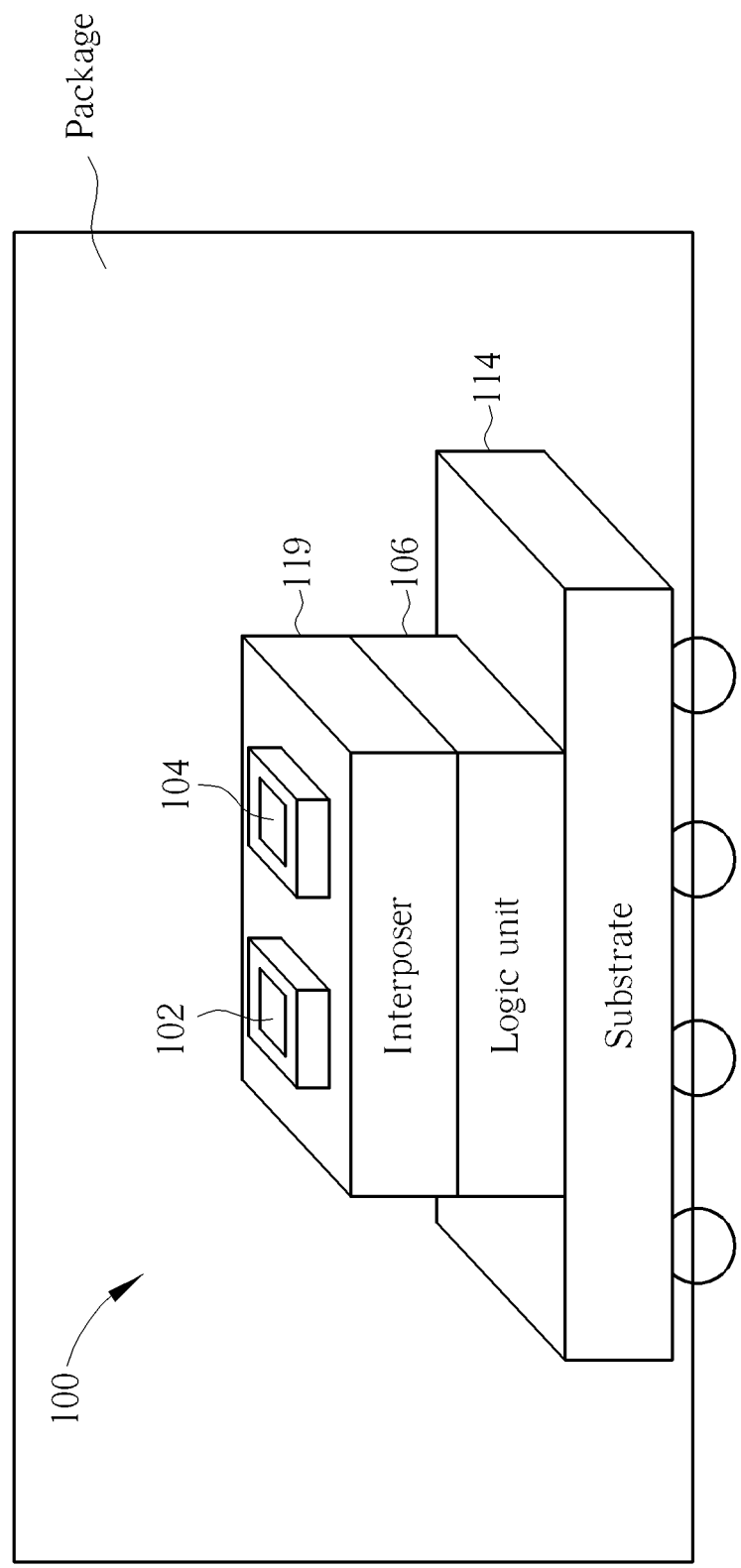
FIG. 6 is a diagram illustrating a cross-section of the high speed memory chip module according to another embodiment.

Please refer to FIG. 6. FIG. 6 is a diagram illustrating a cross-section of the high speed memory chip module 100 according to another embodiment. As shown in FIG. 6, the high speed memory chip module 100 further includes an interposer 119. As shown in FIG. 6, the memory cell array IC 102 and the memory cell array IC 104 are stacked over the interposer 119, the interposer 119 is stacked over the logic unit 106, and the logic unit 106 is stacked over the substrate 114. In addition, the memory cell array IC 102, the memory cell array IC 104, and the logic unit 106 can utilize the wire bonding, the Flip-Chip, the TSVs, or the wireless transmission to connect to each other.

In addition, packages of the high speed memory chip modules in FIG. 2 to FIG. 6 can be Package-in-Package (PIP), Package on package (POP), or System in Package (SIP). In addition, the high speed memory chip modules in FIG. 2, FIG. 3, FIG. 5, and FIG. 6 are exemplary packages of three-dimensional (3D) structure, and the high speed memory chip module in FIG. 4 is an exemplary package of mixed 3D plus 2.5D structure.

In addition, a signal swing of data transmitted through the first transmission bus 108 (that is, a voltage difference between a logic level "0" and a logic level "1" transmitted through the first transmission bus 108) is the same as a signal swing of data received through the first transmission bus 108 (e.g. 1.8V), where the signal swing of data transmitted through the first transmission bus 108 and the signal swing of data received through the first transmission bus 108 can be varied with different memory standards of the memory cell array ICs 102, 104. In addition, for saving power, the logic unit 106 can adjust a signal swing (e.g. 1.8V) of data inputted to the logic unit 106 from the first transmission bus 108 to another or lower signal swing (e.g. 1.2V) inputted to the second transmission bus 110 from the logic unit 106. In addition, a signal swing of data transmitted through the second transmission bus 110 can be the same as a signal swing of data received through the second transmission bus 110 (e.g. 1.2V) whenever required.

In addition, because a semiconductor process of the memory cell array ICs 102, 104 may be different from semiconductor processes of the logic unit 106 and the ASIC (or SOC) processor 112 (e.g. the semiconductor process of the memory cell array ICs 102, 104 can be a 0.13 um-90 nm semiconductor process, the semiconductor process of the logic unit 106 can be a 28 nm-20 nm process, and the process of the ASIC (OR SOC) processor 112 can be a 28 nm-13 nm semiconductor process), the metal-oxide-semiconductor field-effect transistor (MOSFET) gate length of the semiconductor process of the memory cell array ICs 102, 104 is usually longer than the MOSFET gate length of the semiconductor processes of the logic unit 106 and the ASIC (or SOC) processor 112. In another embodiment of the present invention, a signal swing of data transmitted through the first transmission bus 108 can be different from a signal swing of data received through the first transmission bus 108, and a signal swing of data transmitted through the second transmission bus 110 can also be different from a signal swing of data received through the second transmission bus 110.

In addition, in another embodiment of the present invention, a signal swing of data transmitted through the first transmission bus 108 can be different from a signal swing of data received through the first transmission bus 108, and a signal swing of data transmitted through the second transmission bus 110 can be the same as a signal swing of data received through the second transmission bus 110.

In addition, in another embodiment of the present invention, a signal swing of data transmitted through the first transmission bus 108 can be the same as a signal swing of data received through the first transmission bus 108, and a signal swing of data transmitted through the second transmission bus 110 can be different from a signal swing of data received through the second transmission bus 110.

For saving power and take the advantage of different semiconductor processes, in another embodiment of the present invention, a transmitting data rate of the first transmission bus 108 can be different from a receiving data rate of the first transmission bus 108, and a transmitting data rate of the second transmission bus 110 can also be different from a receiving data rate of the second transmission bus 110. In addition, in another embodiment of the present invention, the transmitting data rate of the first transmission bus 108 can be the same as the receiving data rate of the first transmission bus 108, and the transmitting data rate of the second transmission bus 110 can also be the same as the receiving data rate of the second transmission bus 110. In addition, in another embodiment of the present invention, a transmitting data rate of the first transmission bus 108 can be different from a receiving data rate of the first transmission bus 108, and a transmitting data rate of the second transmission bus 110 can also be different from a receiving data rate of the second transmission bus 110, and a signal swing of data transmitted through the first transmission bus 108 can be different from a signal swing of data received through the first transmission bus 108, and a signal swing of data transmitted through the second transmission bus 110 can also be different from a signal swing of data received through the second transmission bus 110.

In addition, as shown in FIG. 1, the type of memory cell array group 101 composed of the memory cell array IC 102 and the memory cell array IC 104 can have different size and bus width. For example, if size and bus width of each memory cell array of the memory cell array IC 102 and the memory cell array IC 104 are 512M and 32 bits, size and bus width of the type of memory cell array group 101 can be 512M and 128 bits, or 1 G and 64 bits. But, the present invention is not limited to size and bus width of the type of memory cell array group 101 composed of the memory cell array IC 102 and the memory cell array IC 104 being 512M and 128 bits, or 1 G and 64 bits. In addition, if size and bus width of the memory cell array IC 102 are 512M and 64 bits and size and bus width of the memory cell array IC 104 are 1 G and 64 bits, size and bus width of the type of memory cell array group 101 composed of the memory cell array IC 102 and the memory cell array IC 104 can be 1.5 G and 128 bits.

Figure 7:
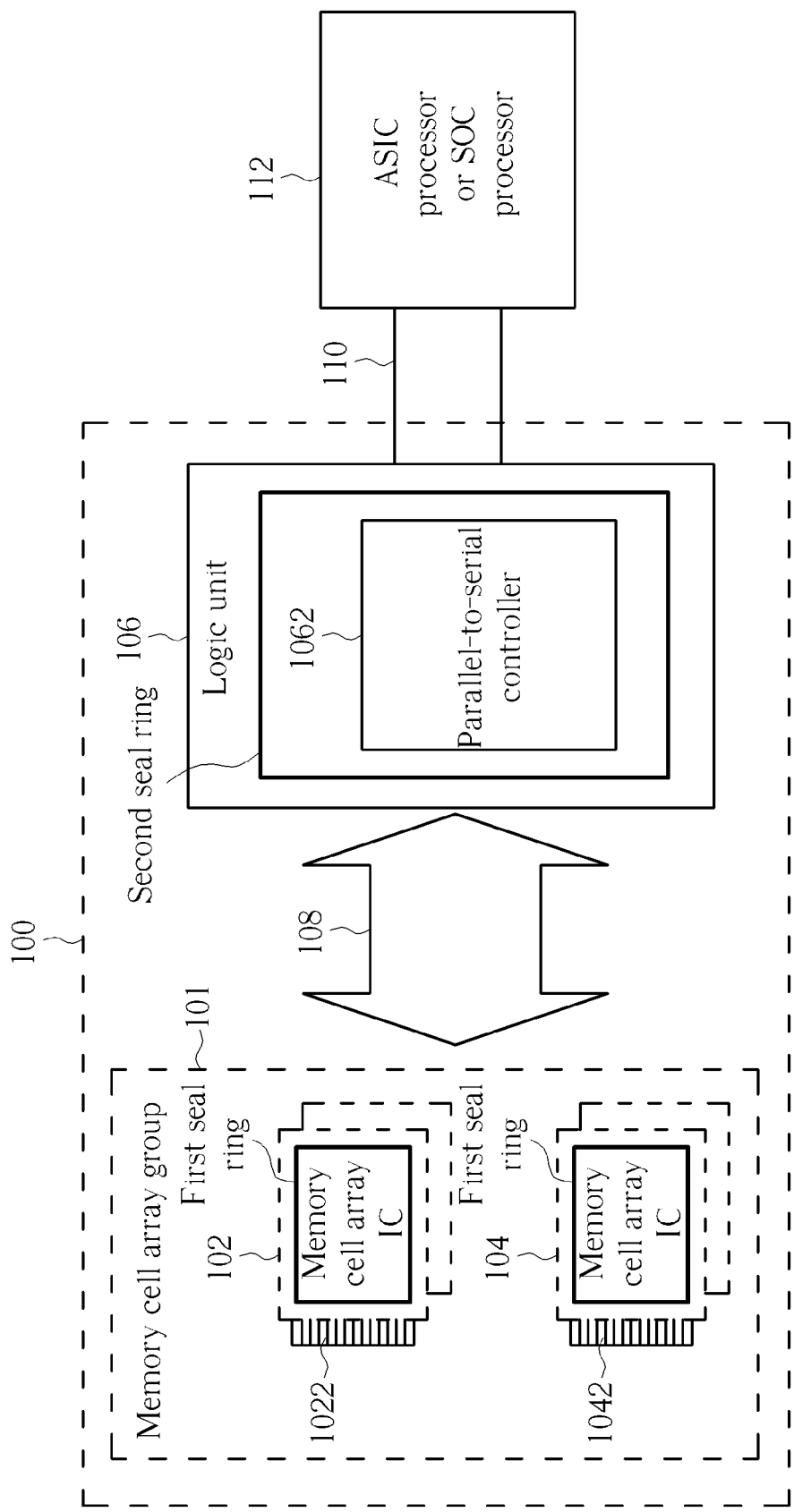
FIG. 7 is a diagram illustrating each of the memory cell array ICs corresponding to a first seal ring and the logic unit corresponding to a second seal ring.

Please refer to FIG. 7. FIG. 7 is a diagram illustrating each of the memory cell array IC 102 and the memory cell array IC 104 corresponding to a first seal ring and the logic unit corresponding to a second seal ring. As shown in FIG. 7, a circuit of each of the memory cell array IC 102 and the memory cell array IC 104 is surrounded by a first seal ring and a circuit of the logic unit 106 is surrounded by the second seal ring.

Figure 8:
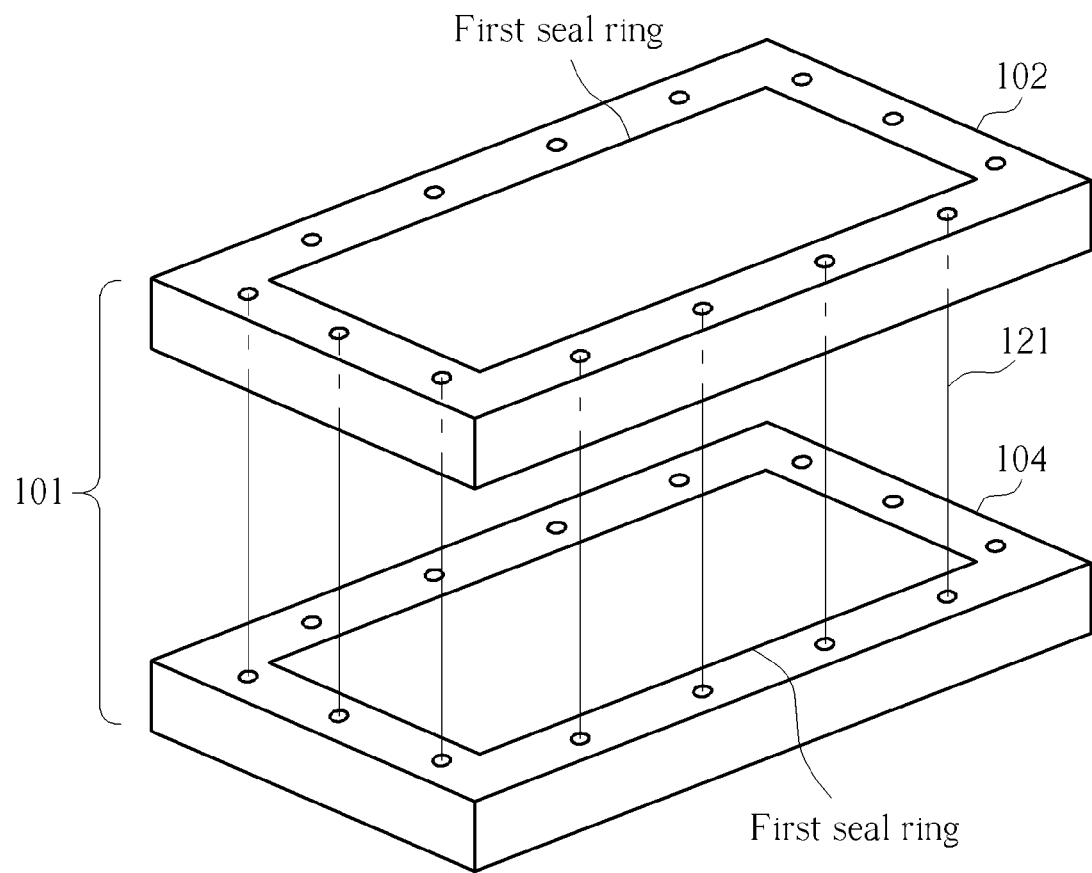
FIG. 8 is an explosion diagram illustrating a plurality of TSVs existing outside a first seal ring of each of the memory cell array ICs, where the plurality of TSVs are used for connecting to a power or a ground supply.

Please refer to FIG. 8. FIG. 8 is an explosion diagram illustrating a plurality of TSVs existing outside a first seal ring of each of the memory cell array ICs, where the plurality of TSVs are used for connecting to a power or a ground supply. But, the present invention is not limited to a plurality of TSVs existing outside a first seal ring of each memory cell array IC. That is to say, at least one TSV exists outside a first seal ring of each memory cell array IC. As shown in FIG. 8, relative positions and an amount of a plurality of TSVs existing outside a first seal ring of each memory cell array IC are the same. Because relative positions and an amount of a plurality of TSVs existing outside a first seal ring of each memory cell array IC are the same, when the memory cell array IC 102 and the memory cell array IC 104 are stacked each other, a metal fence 121 surrounding the memory cell array IC 102 and the memory cell array IC 104 can be formed through a plurality of TSVs existing outside a first seal ring of each memory cell array IC (FIG. 8 only shows two sides of the metal fence 121), where the metal fence 121 has electromagnetic interference (EMI) shielding effect, better heat dissipation capability, and with better external noise isolation functions. In addition, because a plurality of TSVs existing outside a first seal ring of each memory cell array IC are used for connecting to the power or the ground supply, power or ground line areas within a first seal ring of each memory cell array IC for connecting to the power or the ground supply can be saved.

Figure 9:
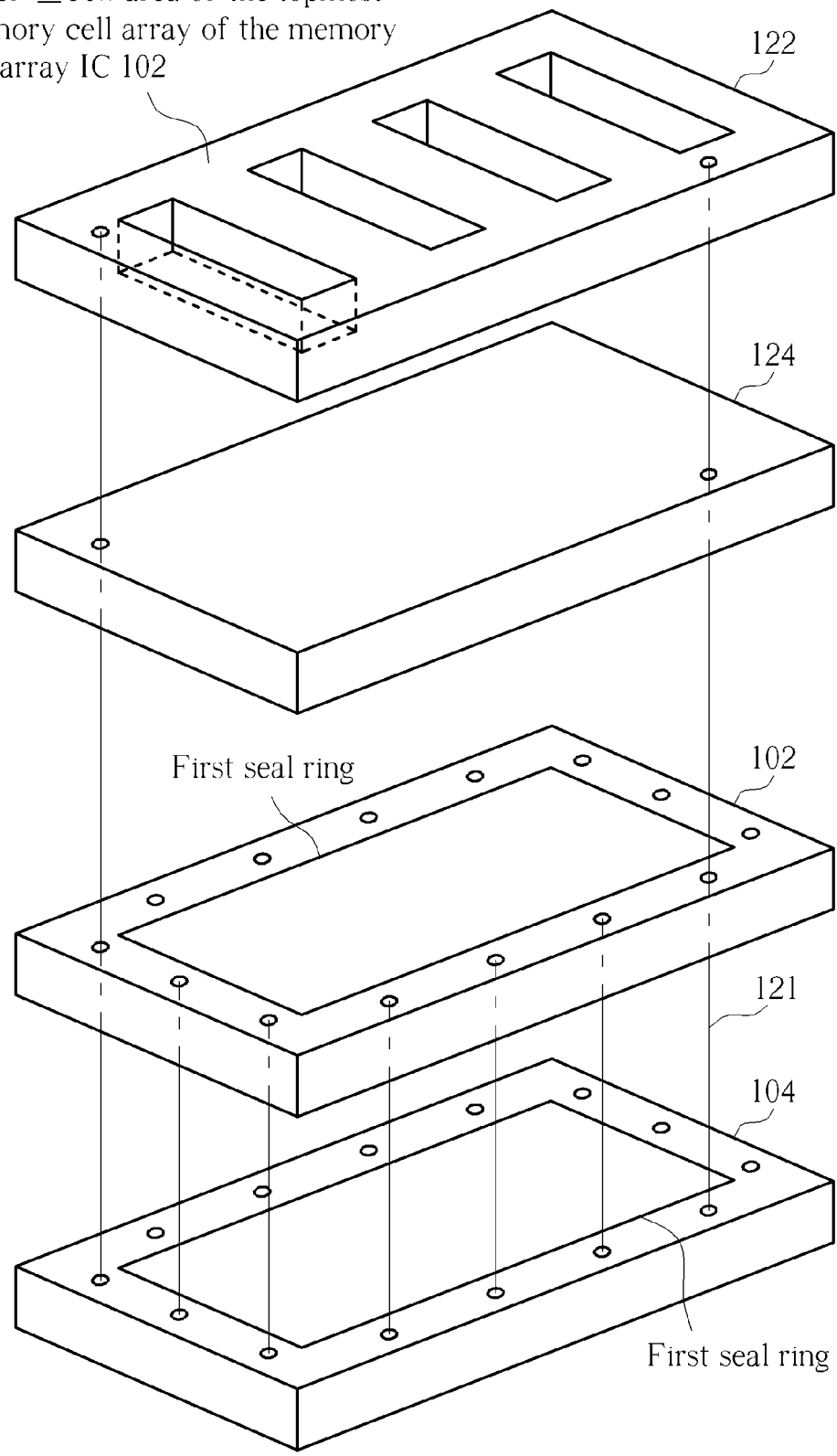
FIG. 9 is an explosion diagram illustrating the high speed memory chip module further including a metal layer and an insulation layer when the high speed memory chip module has the 3D structure.

Please refer to FIG. 9. FIG. 9 is an explosion diagram illustrating the high speed memory chip module 100 further including a metal layer 122 and an insulation layer 124 when the high speed memory chip module 100 has the 3D structure. As shown in FIG. 9, the metal layer 122 is disposed over a topmost memory cell array of the memory cell array IC 102, and the insulation layer 124 is disposed between the metal layer 122 and the topmost memory cell array of the memory cell array IC 102, where the metal layer 122 can be electrically connected to the topmost memory cell array of the memory cell array IC 102 through at least one TSV of the insulation layer 124, and the metal layer 122, which can be a single piece or a slotted piece, covers more than 50% area of the topmost memory cell array of the memory cell array IC 102. In another embodiment, the metal layer can be connected to a power or a ground supply through a least one TSV as to perform better EMI shielding performance.

Figure 10:
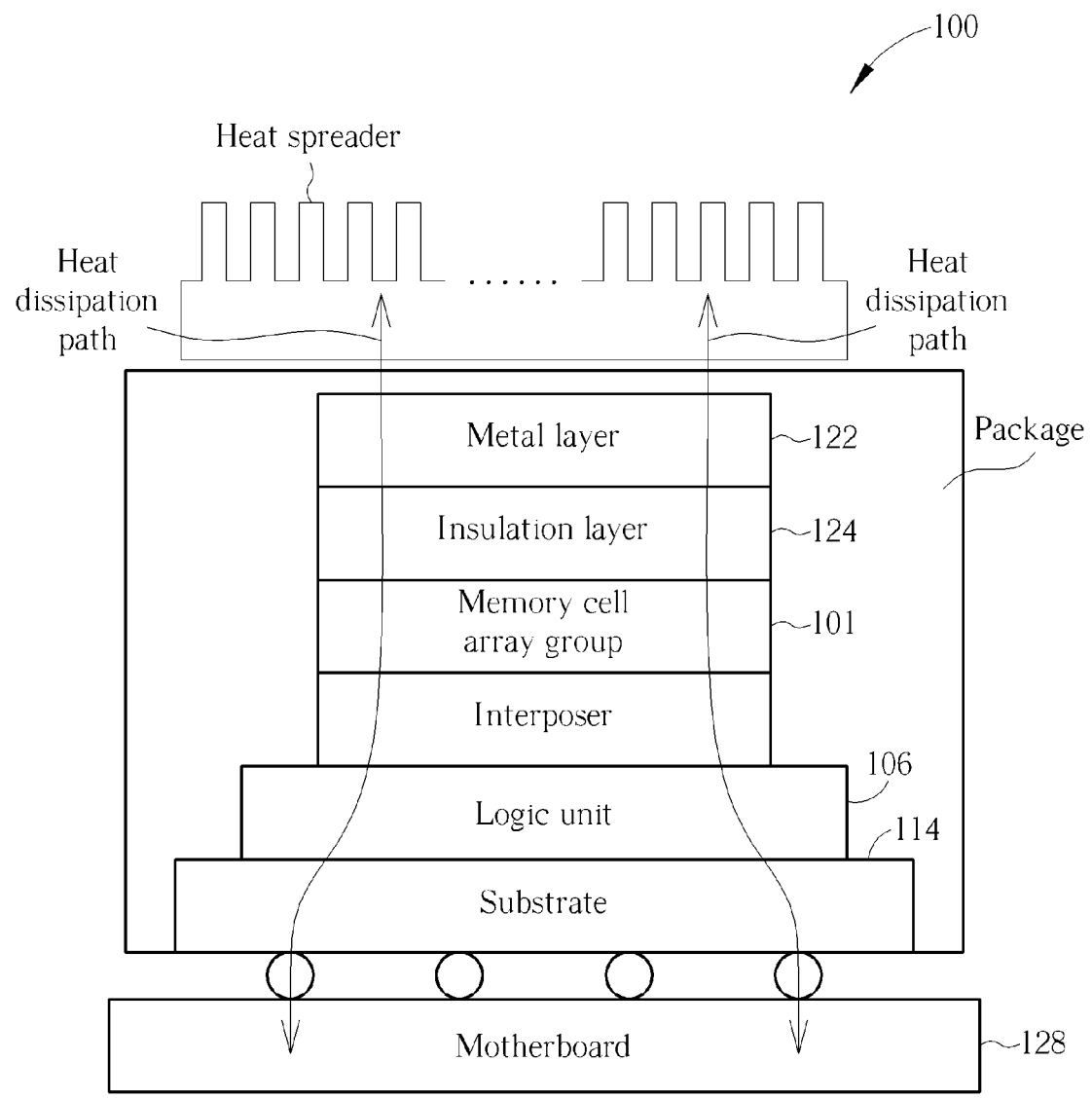
FIG. 10 is a cross-section diagram illustrating heat dissipation paths of the high speed memory chip module in FIG. 9.

Please refer to FIG. 10. FIG. 10 is a cross-section diagram illustrating heat dissipation paths of the high speed memory chip module 100 in FIG. 9. As shown in FIG. 10, the high speed memory chip module 100 can utilize a plurality of TSVs existing outside first seal rings of the memory cell array IC 102 to upward dissipate heat through the metal layer 122, or utilize the metal fence 121 to dissipate heat to a substrate 114 or a motherboard 128 through a plurality of TSVs of the logic unit 106 and the substrate 114 (as shown in arrows in FIG. 10).

Figure 11:
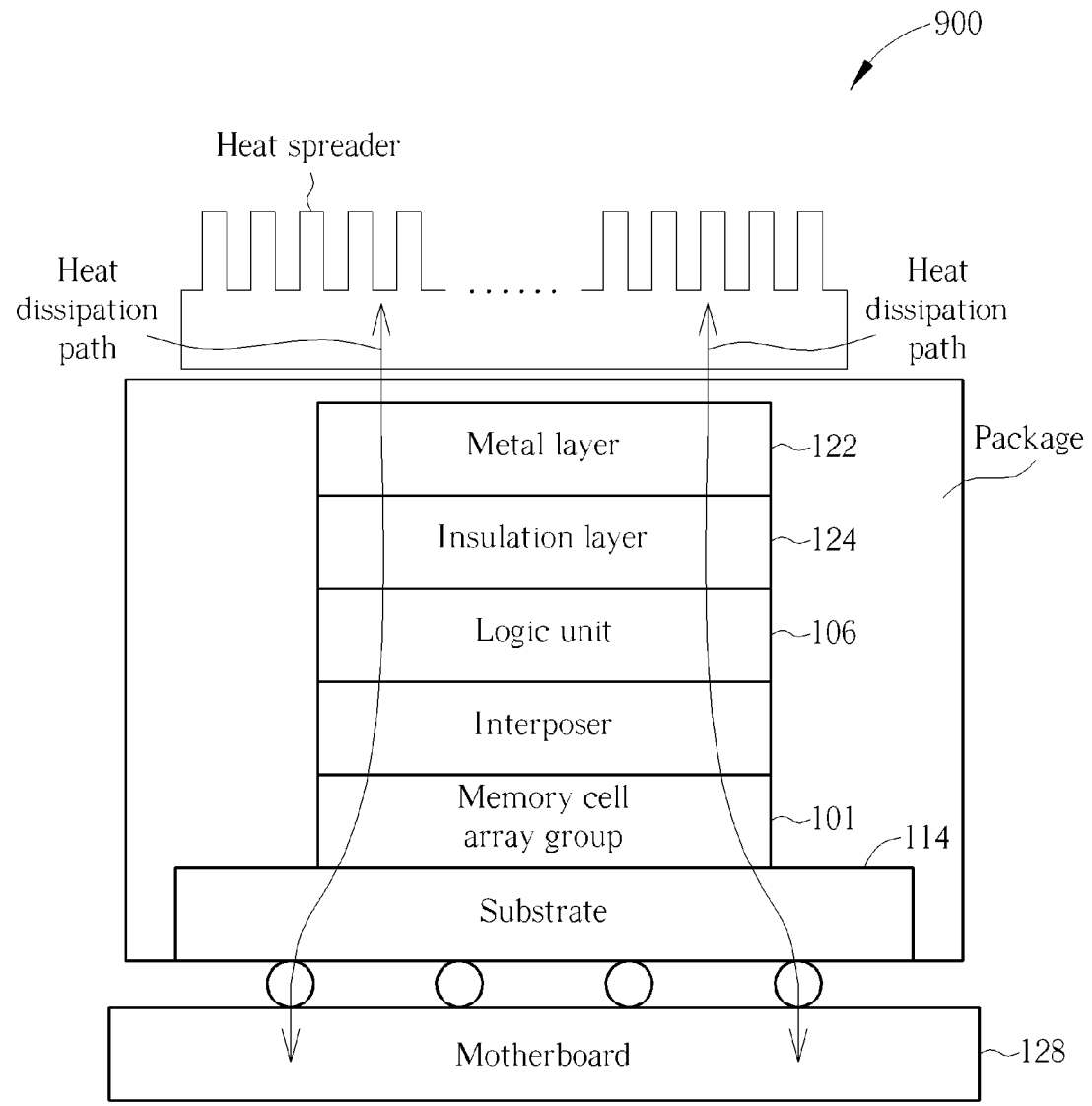
FIG. 11 is a cross-section diagram illustrating heat dissipation paths of a high speed memory chip according to another embodiment.

Please refer to FIG. 11. FIG. 11 is a cross-section diagram illustrating heat dissipation paths of a high speed memory chip 900 according to another embodiment, where a difference between the high speed memory chip module 900 and the high speed memory chip module 100 in FIG. 10 is that a logic unit 106 of the high speed memory chip module 900 is stacked over the type of memory cell array group 101. A plurality of TSVs exist outside a first seal ring of each of the memory cell array IC 102 and the memory cell array IC 104, and the plurality of TSVs existing outside the second seal ring of the logic unit 106 are used for connecting to the power or the ground supply. But, the present invention is not limited to the plurality of TSVs existing either inside or outside of the second seal ring of the logic unit 106. That is to say, at least one TSV exists outside the second seal ring of the logic unit 106. As shown in FIG. 11, the metal layer 122 is disposed over the logic unit 106, and the insulation layer 124 is disposed between the metal layer 122 and the logic unit 106, where the metal layer 122 can be electrically connected to the logic unit 106 through at least one TSV of the insulation layer 124, and the metal layer 122 covers more than 50% area of the logic unit 106. In addition, as shown in FIG. 11, the high speed memory chip module 900 can utilize the plurality of TSVs existing outside the second seal ring of the logic unit 106 to upward dissipate heat through the metal layer 122, or utilize the metal fence 121 to dissipate heat to the motherboard 128 through the plurality of TSVs of the substrate 114 (as shown in arrows in FIG. 11). In addition, because the plurality of TSVs existing outside the second seal ring of the logic unit 106 are used for connecting to the power or the ground supply, power or ground supply line area within the second seal ring of the logic unit 106 for connecting to the power or the ground supply can be saved.

Figure 12:
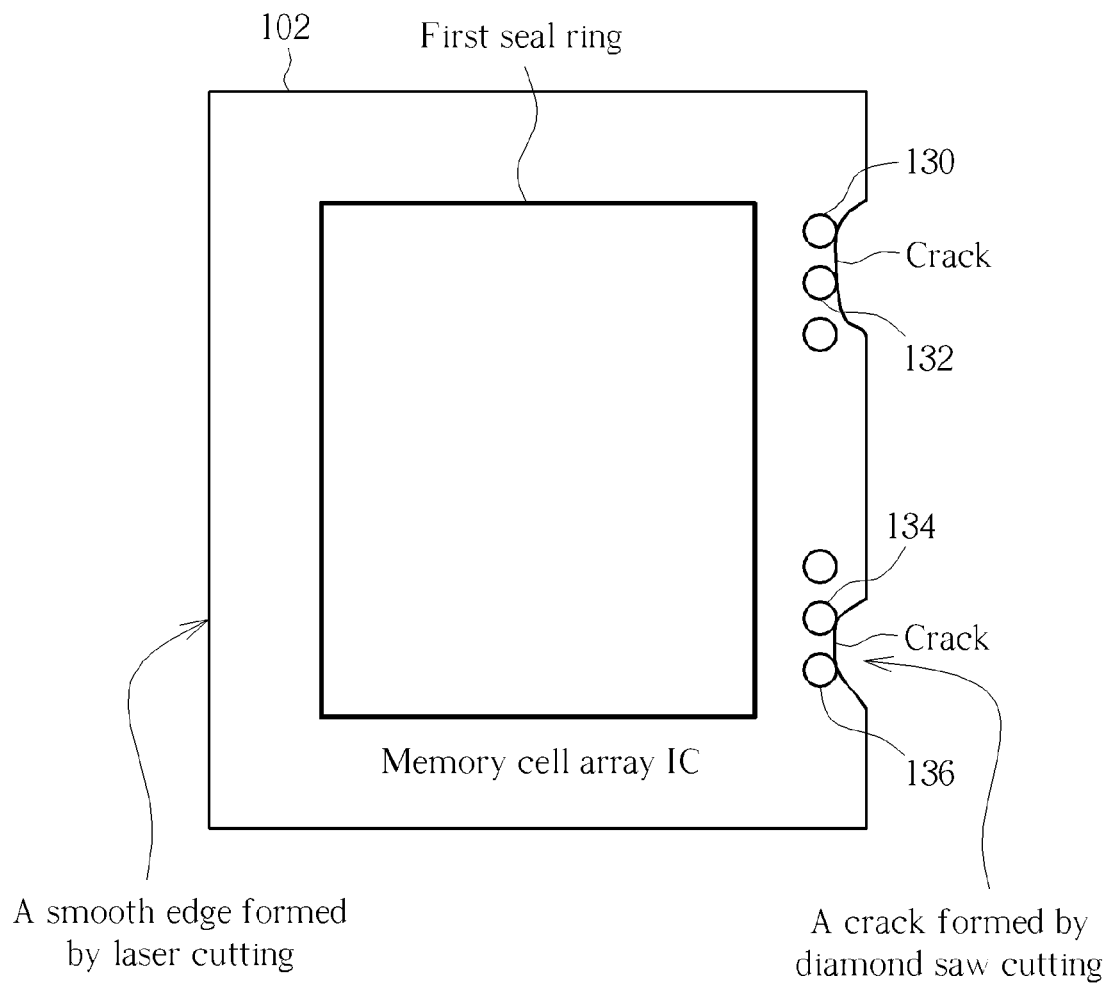
FIG. 12 is a top view illustrating an edge of the memory cell array IC showing cracks during the assembly or package manufacturing process of the high speed memory chip module in FIG. 8.

Please refer to FIG. 12. FIG. 12 is a top view illustrating an edge of the memory cell array IC 102 showing cracks during the assembly or package manufacturing process of the high speed memory chip module 100 in FIG. 8. As shown in FIG. 12, when an edge of the memory cell array IC 102 shows cracks, the cracks will not impact the nominal function of the memory cell array IC and it will just make TSVs 130, 132 connected to the power short-circuit together, and TSVs 134, 136 connected to the ground supply short-circuit together. Thus, because the TSVs 130, 132 are short-circuit together, and the TSVs 134, 136 are short-circuit together, the metal fence 121 becomes wider, resulting in the EMI shielding effect, the heat dissipation capability, and the external noise isolation function of the metal fence 121 being enhanced. In addition, because the EMI shielding effect, the heat dissipation capability, and the external noise isolation function of the metal fence 121 are enhanced, the cracks in FIG. 12 will not impact the nominal function and as a result it can also increase the assembly or package manufacturing yield of the high speed memory chip module 100.

On the other hand, the conventional diamond-saw cutting method cannot cut the multiple memory cell array ICs into individual dies without creating the die-edge cracks. In another embodiment, to overcome the die-edge crack drawbacks of diamond-saw cutting method, the dicing or cutting method comprises at least a Laser cutting or dicing process step for at least one of the multiple memory cell array ICs. As an exemplary case, the multiple memory cell array ICs can be treated by the Laser cutting process step either before or after a conventional diamond-saw cutting steps to reduce the die-edge cracks and improve the manufacturing yield and final system device level reliability.

Figure 13:
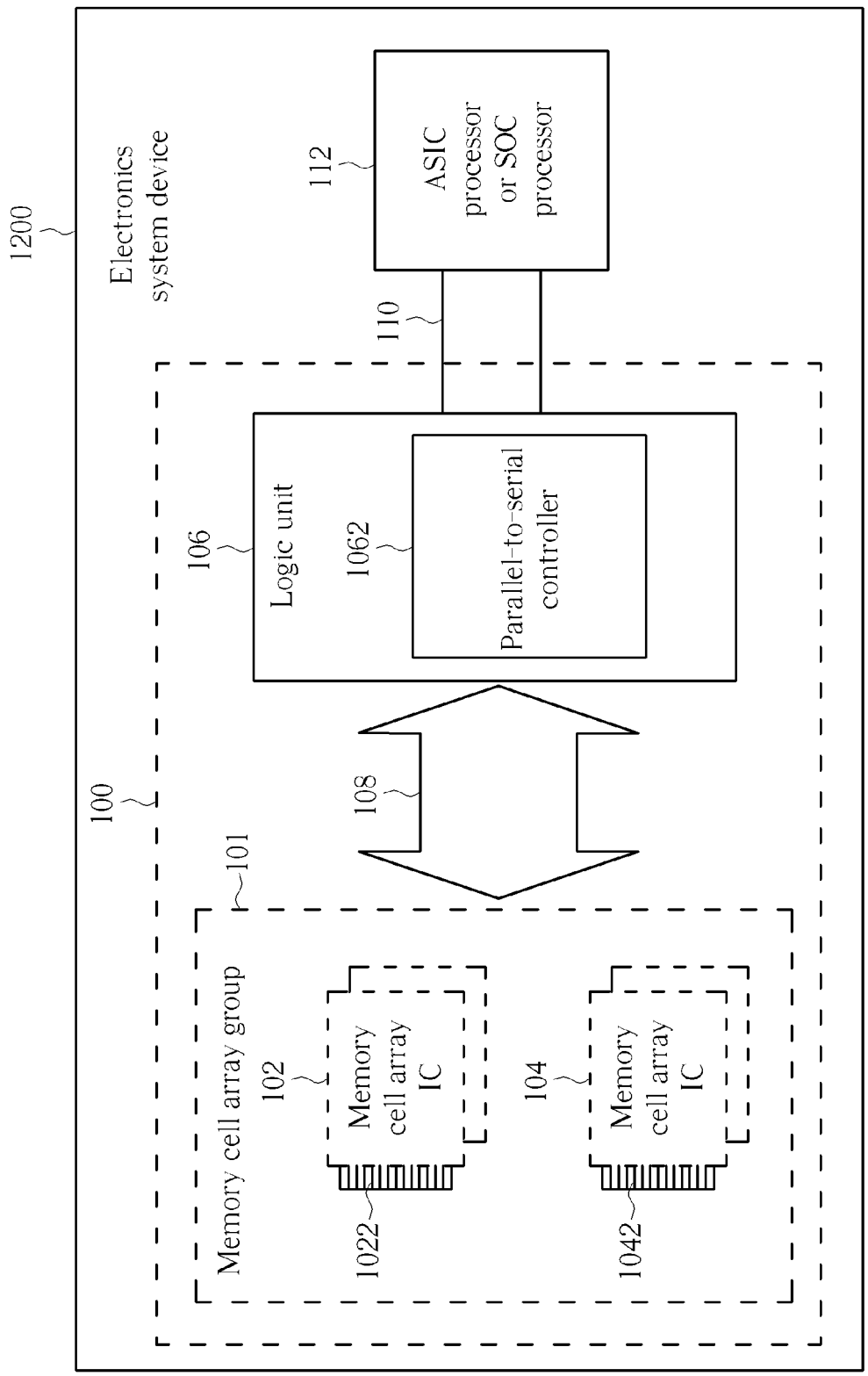
FIG. 13 is a diagram illustrating a electronics system device with a high speed memory chip module according to another embodiment.

Please refer to FIG. 13. FIG. 13 is a diagram illustrating a electronics system device 1200 with a high speed memory chip module according to another embodiment. The electronics system device 1200 utilizes the PIP, the POP, or the SIP to integrate the ASIC (or SOC) processor 112, the memory cell array IC 102, the memory cell array IC 104, and the logic unit 106. Because the ASIC (or SOC) processor 112, the memory cell array IC 102, the memory cell array IC 104, and the logic unit 106 are the same as the ASIC (or SOC) processor 112, the memory cell array IC 102, the memory cell array IC 104, and the logic unit 106 in FIG. 1, so further descriptions thereof are omitted for simplicity.

To sum up, the high speed memory chip module and the electronics system device with the high speed memory chip module provided by the present invention have advantages as follows: first, a signal swing of data transmitted through the first transmission bus and a signal swing of data transmitted through the second transmission bus can be varied with different memory standards or different semiconductor processes. So, the present invention not only has lower power consumption while operating, but also has higher transmission efficiency. Second, the present invention can utilize a plurality of TSVs outside a first seal ring of each memory cell array or a plurality of TSVs outside a second seal ring of the logic unit to form a metal fence, so the present invention has better EMI shielding effect, better heat dissipation capability, and an external noise isolation function based on the magnetic-electronic theory available today. Therefore, compared to the prior art, the present invention has lower power consumption, higher transmission efficiency, better EMI shielding effect, better heat dissipation capability, and with better external noise isolation functions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high speed memory chip module, comprising:
   a type of memory cell array group, wherein the type of memory cell array group comprises multiple memory cell array integrated circuits (ICs), each of the memory cell array ICs has an input/output (I/O) data bus and at least one memory cell array corresponding to a first metal-oxide-semiconductor field-effect transistor (MOSFET) process, wherein the first MOSFET process corresponding to a first MOSFET gate length; and
   a logic unit for accessing the type of memory cell array group through a first transmission bus, wherein the first transmission bus is used for transmitting a first set of parallel data along with the memory cell array ICs, and bus width of the first transmission bus is wider than bus width of an I/O data bus of each of the memory cell array ICs,
   wherein the logic unit corresponds to a second MOSFET process, the second MOSFET process corresponds to a second MOSFET gate length, and the first MOSFET gate length is longer than the second MOSFET gate length;
   wherein the logic unit is further used for converting the first set of parallel data of the first transmission bus into a second set of parallel data through a second transmission bus.

2. The high speed memory chip module of claim 1, wherein the multiple memory cell array ICs of the type of memory cell array group comprise a flash IC or a Dynamic Random Access Memory (DRAM) IC, wherein a dicing method for at least one memory cell array IC comprises a Laser cutting process.

3. The high speed memory chip module of claim 1, further comprising:
   an interposer, wherein at least one memory cell array IC of the memory cell array group and the logic unit are disposed over two opposite sides of the interposer, respectively, wherein the interposer comprises silicon or oxide glass material.

4. The high speed memory chip module of claim 1, further comprising:
   an interposer, wherein the multiple memory cell array ICs are disposed over the interposer respectively, and the interposer is disposed over the logic unit, wherein the interposer comprises silicon or oxide glass material, wherein a dicing method for at least one memory cell array IC comprises a Laser cutting process.

5. The high speed memory chip module of claim 1, wherein the logic unit further comprises:
   a parallel-to-serial controller module for converting the first set of parallel data into the second set of parallel data, and the logic unit transmits the second set of parallel data to an application-specific integrated circuit (ASIC) or a system on chip (SOC) processor through the second transmission bus, wherein bit width of the first set and the second set of parallel data are different.

6. The high speed memory chip module of claim 5, wherein the second transmission bus is a bus comprising the protocol of Universal Serial Bus (USB), a Serial Advanced Technology Attachment (SATA) bus, a Universal Flash Storage (UFS) bus, a mobile industry processor interface (MIPI) bus, or a Peripheral Component Interconnect Express (PCIE) bus.

7. The high speed memory chip module of claim 5, wherein a signal swing of data transmitted through the first transmission bus and a signal swing of data received through the first transmission bus are different.

8. The high speed memory chip module of claim 5, wherein a signal swing of data transmitted through the second transmission bus and a signal swing of data received through the second transmission bus are different.

9. The high speed memory chip module of claim 5, wherein a transmitting data rate of the first transmission bus and a receiving data rate of the first transmission bus are different.

10. The high speed memory chip module of claim 5, wherein a transmitting data rate of the second transmission bus and a receiving data rate of the second transmission bus are different.

11. The high speed memory chip module of claim 1, wherein each of the memory cell array ICs of the type of memory cell array group corresponds to a first seal ring and the logic unit corresponds to a second seal ring, a circuit of each of the memory cell array ICs is surrounded by a first seal ring and a circuit of the logic unit is surrounded by the second seal ring.

12. The high speed memory chip module of claim 11, wherein at least one through silicon via (TSV) exists outside a first seal ring of each of the memory cell array ICs.

13. The high speed memory chip module of claim 12, further comprising:
   a metal layer disposed over a topmost memory cell array of the type of memory cell array group, wherein the metal layer covers more than 50% area of the topmost memory cell array.

14. The high speed memory chip module of claim 12, wherein the at least one TSV is used for connecting to a power or a ground supply.

15. The high speed memory chip module of claim 11, wherein at least one TSV exists outside the second seal ring of the logic unit.

16. The high speed memory chip module of claim 15, wherein the logic unit is stacked over a topmost memory cell array IC of the type of memory cell array group.

17. The high semiconductor speed memory chip module of claim 16, further comprising: a metal layer disposed over the logic unit, wherein the metal layer covers more than 50% area of the logic unit.

18. The high speed memory chip module of claim 15, wherein the at least one TSV is used for connecting to a power or a ground supply.

19. A electronics system device with a high speed memory chip module, the device comprising:
- an ASIC processor;
- a type of memory cell array group, wherein the type of memory cell array group comprises multiple memory cell array ICs, each of the memory cell array ICs has an (I/O) data bus; and
- a logic unit for accessing the type of memory cell array group through a first transmission bus, wherein the first transmission bus is used for transmitting a first set of parallel data along with the memory cell array ICs, and bus width of the first transmission bus is wider than bus width of an (I/O) data bus of each of the memory cell array ICs, wherein the logic unit is further used for converting the first set of parallel data of the first transmission bus into a second set of parallel data through a second transmission bus, and transmits the second set of parallel data to the ASIC processor;
- wherein the ASIC processor executes a predetermined function corresponding to the second set of parallel data while the ASIC processor is under operating condition, wherein bit width of the first set and the second set of parallel data are different.

20. The electronics system device of claim 19, further comprising:
- an interposer, wherein at least one memory cell array IC of the memory cell array group and the logic unit are disposed over two opposite sides of the interposer, respectively, wherein the interposer comprises silicon or oxide glass material, wherein a dicing method for at least one memory cell array ICs comprises a Laser cutting process.

21. The electronics system device of claim 19, further comprising:
- an interposer, wherein the multiple memory cell array ICs are disposed over the interposer respectively, and the interposer is disposed over the logic unit, wherein the interposer comprises silicon or oxide glass material.

22. The electronics system device of claim 19, wherein the logic unit comprises:
- a parallel-to-serial controller module for converting the first set of parallel data into the second set of parallel data.

23. The electronics system device of claim 22, wherein a signal swing of data transmitted through the first transmission bus and a signal swing of data received through the first transmission bus are different.

24. The electronics system device of claim 22, wherein a signal swing of data transmitted through the second transmission bus and a signal swing of data received through the second transmission bus are different.

25. The electronics system device of claim 22, wherein a transmitting data rate of the first transmission bus and a receiving data rate of the first transmission bus are different.

26. The electronics system device of claim 22, wherein a transmitting data rate of the second transmission bus and a receiving data rate of the second transmission bus are different.

27. The electronics system device of claim 19, wherein each of the memory cell array ICs of the type of memory cell array group corresponds to a first seal ring and the logic unit corresponds to a second seal ring, a circuit of each of the memory cell array ICs is surrounded by the first seal ring and a circuit of the logic unit is surrounded by the second seal ring.

28. The electronics system device of claim 27, wherein at least one TSV exists outside a first seal ring of each of the memory cell array ICs.

29. The electronics system device of claim 28, further comprising:
- a metal layer disposed over a topmost memory cell array IC of the type of memory cell array group, wherein the metal layer covers more than 50% area of the topmost memory cell array IC, wherein the memory cell array ICs are stacked over the logic unit.

30. The electronics system device of claim 28, wherein the at least one TSV is used for connecting to a power or a ground supply.

31. The electronics system device of claim 27, wherein at least one TSV exists outside the second seal ring of the logic unit.

* * * * *